United States Patent [19]

Lowe

[11] Patent Number: 4,668,545
[45] Date of Patent: May 26, 1987

[54] ARTICLES COMPRISING SHAPED WOVEN FABRICS

[75] Inventor: Frank J. Lowe, Swindon, United Kingdom

[73] Assignee: Raychem Corp., Menlo Park, Calif.

[21] Appl. No.: 775,843

[22] Filed: Sep. 13, 1985

[30] Foreign Application Priority Data

Sep. 14, 1984 [GB] United Kingdom ............... 8423219

[51] Int. Cl.⁴ ..................... F16L 5/02; B32B 3/20; B32B 7/00; D03D 3/02
[52] U.S. Cl. .................................. 428/36; 428/188; 428/257; 428/365; 139/387 R
[58] Field of Search .............. 428/35, 162, 192, 212, 428/913, 36, 188, 257, 365; 139/387 R

[56] References Cited

U.S. PATENT DOCUMENTS

| | | | |
|---|---|---|---|
| 4,305,988 | 12/1981 | Kocher | 428/158 |
| 4,333,978 | 6/1982 | Kocher | 428/158 |
| 4,569,868 | 2/1986 | De Blauwe et al. | 428/35 |
| 4,576,666 | 3/1986 | Harris et al. | 156/85 |

FOREIGN PATENT DOCUMENTS

| | | |
|---|---|---|
| 657558 | 9/1951 | United Kingdom . |
| 767954 | 2/1957 | United Kingdom . |
| 783883 | 10/1957 | United Kingdom . |
| 825183 | 12/1959 | United Kingdom . |
| 885097 | 12/1961 | United Kingdom . |
| 1286630 | 8/1972 | United Kingdom . |
| 1374280 | 11/1974 | United Kingdom . |
| 1483040 | 8/1977 | United Kingdom . |
| 2084505 | 4/1982 | United Kingdom . |

Primary Examiner—John E. Kittle
Assistant Examiner—Patrick J. Ryan
Attorney, Agent, or Firm—T. Gene Dillahunty

[57] ABSTRACT

A dimensionally-recoverable fabric having an angled or branched hollow region woven therein. The fabric may have conductive fibres by means of which it exhibits electromagnetic screening. Alternatively, or additionally it may have heat-softenable or hot-melt fibres such that it becomes impermeable or is capable of bonding to a substrate on heating.

20 Claims, 17 Drawing Figures

WEFT PICKS

WARP

ARTICLES COMPRISING SHAPED WOVEN FABRICS

FIELD OF THE INVENTION

The present invention relates to heat-activatable shaped hollow woven fabrics, where the shape is inherent in the weave rather than produced by sewing or otherwise joining together simple sheets. Heat-activation may result in for example dimensional recovery, an increase in rigidity caused for example by curing, or adhesive activation causing impermeability or bonding to a substrate.

BACKGROUND OF THE INVENTION

Shaped hollow fabrics have many uses, but the present specification will deal primarily with those fabrics useful in the energy, telecommunications, electronics, pipeline and related industries. For example, substrates of complex shape may require interconnection, mechanical fixing, environmental protection or electrical screening etc. In each of those examples some form of encapsulation of the substrate may be required and a correspondence in size and shape between the substrate and its covering will be desirable. Hence the reason for the shaping and the hollow configuration. We have found that shaped fabrics are for some uses preferable over moulded parts due to their excellent creep performance, high strength and abrasion resistance and lack of tendency to split once cut or scored, and due to the in-line manufacturing techniques available for their production.

Hitherto hollow articles for encapsulation in the fields with which we are primarily concerned have almost always consisted of moulded material, although knitting has of course been used to make shaped articles such as gloves. For example articles such as boots (an article for encapsulation having generally about two outlets arranged at an angle to one one another), end caps, transitions and udders (an article for encapsulation having generally three or more outlets towards one end thereof) have been made from plastics materials by injection, compression or transfer moulding. These articles may be used to seal joints between cables or between pipes and to seal terminations of cables etc.

The fact that such hollow articles are preferably designed with a specific substrate in mind means that an excellent seal can be achieved resulting in good performance. The disadvantage, however, is that they are expensive to produce, especially in small quantities, because a mould has to be made for each design. Also, it may be desirable to provide an internal coating of an adhesive (for environmental sealing) or a metal (for electromagnetic screening) within the hollow article, and such coating may be extremely difficult to carry out accurately.

SUMMARY OF THE INVENTION

We have discovered that these problems may be overcome if the hollow article is made by weaving.

Thus, the present invention provides a heat-activatable article comprising a fabric having an angled or branched hollow region woven therein.

By angled or branched we exclude simple hollow regions such as cylinders or others of infinite rotational symmetry (neglecting the fact that any such hollow will be generally flattened) which can be made easily by other techniques.

DESCRIPTION OF THE INVENTION

The article is preferably heat-activatable by virtue of the fabric being woven from heat-recoverable fibres, heat-curable fibres or heat-activatable adhesive (heat-softenable or hot-melt) fibres. Two or more of these may be combined. Alternatively, or additionally, heat-activation may result from insertion or addition of another material after weaving.

Preferably the fabric forms at least part of an article for screening an electrical component, the fabric having as a component thereof fibres comprising an electrically conductive material. The article preferably has means for electrically terminating said fibres for example to an adjacent screen. The article after recovery preferably has a surface transfer impedance of 5 ohm/m or less, measured over a frequency of from 1–50 MHz. Alternatively, the article may be used to provide environmental protection. A further use is as a structural article for example for use as a support or as a part of a larger article. In this case heat-activation may usefully comprise heat-curing to produce an increase in rigidity.

The configuration of the hollow region may be altered at will simply by altering the pattening program on the loom. The work involved in altering the weave design produced by a loom may be contrasted with the work involved in producing a new mould for, say, an injection moulding machine. The second major advantage of the invention over the prior art is that the various functions required of the finished article may result from the weaving together of many different fibres, each the best for a single specific function. Thus, environmental protection may be provided by a hollow T or other branch-piece woven from fibres of high density polyethylene for mechanical strength and from fibres of a polyamide which can be caused to melt to provide a impervious adhesive layer. The weave design may be chosen such that the polyethylene appears primarily on the outside of the article and the polyamide adhesive appears primarily on the inside. This is analogous to an internally coated moulded part, but it is significantly easier to produce reliably and with accuracy, especially as regards the amount and positioning of the adhesive.

One property that is important in the art of environmental encapsulation and connection is dimensional-recoverability, by means of which an article initially of one size or shape can be made to change its dimensions. Thus a hollow article can be manufactured, for example oversized, such that it can be installed easily. After appropriate treatment it fits tightly. Although recoverability can allow reasonable tolerances in manufacture, this is generally only as regards size, and products still must be made of a particular topology.

Recoverable articles generally recover on suitable treatment, such as heating, towards an original shape from which they have previously been deformed but the term recoverable as used herein includes an article which adopts a new configuration even if it has not previously been deformed. The fabric of the present invention may be recoverable in order that it may be easily installed, and recoverability is preferably included by weaving recoverable fibres rather than by deforming, for example stretching, the woven fabric. As applied to the fabric, therefore, the term recoverable relates to the adoption of a new configuration in the absence of previous deformation.

The present invention also provides a method of protecting or holding a substrate comprising a cable or cable splice which comprises surrounding the substrate by a heat-activatable article comprising a fabric having a hollow region woven therein, which hollow corresponds to the configuration of the substrate. The fabric is preferably dimensionally-recoverable, and the hollow may be angled or branched. Recoverability may allow the article to grip the substrate thereby holding it together, protecting it and/or attaching it to some other article.

The provision of recoverability by weaving recoverable fibres leads to a further significant advantage over the prior art moulding methods. In the prior art such hollow articles required deformation, for example, by expansion after their formation. It is not of course possible to produce, say, a heat-shrinkable moulded part directly from a heat-shrinkable material by a thermoforming technique. This problem is avoided by weaving, since shape results from the pattening program rather than from a thermoforming process.

A few general remarks about recoverable articles may usefully be made. In their most common form, such articles comprise a heat-shrinkable sleeve made from a polymeric material exhibiting the property of elastic or plastic memory as described, for example, in U.S. Pat. Nos. 2,027,962; 3,086,242 and 3,597,372. As is made clear in, for example, U.S. Pat. No. 2,027,962, the original dimensionally heat-stable form may be a transient form in a continuous process in which, for example, an extruded tube is expanded, whilst hot, to a dimensionally heat-unstable form but, in other applications, a preformed dimensionally heat stable article is deformed to a dimensionally heat-unstable form in a separate stage. In the present case, fibres may become recoverable merely as a result of an extrusion step, but recovery or further recovery may be induced by subsequent stretching for example after initial take-up.

In the production of heat-recoverable articles, the polymeric material may be cross-linked at any stage in the production of the article that will enhance the desired dimensional recoverability. One manner of producing a heat-recoverable article comprises shaping the polymeric material into the desired heat-stable form, subsequently cross-linking the polymeric material, heating the article to a temperature above the crystalline melting point or, for amorphous materials the softening point, as the case may be, of the polymer, deforming the article and cooling the article whilst in the deformed state so that the deformed state of the article is retained. In use, since the deformed state of the article is heat-unstable, application of heat will cause the article to assume its original heat-stable shape.

In other articles, as described, for example, in British Pat. No. 1,440,524, an elastomeric member such as an outer tubular member is held in a stretched state by a second member, such as an inner tubular member, which, upon heating, weakens and thus allows the elastomeric member to recover.

The fabric is preferably made by at least notionally splitting a zone of warp fibres into at least a first group of fibres and a second group of fibres, such that the fibres of the first group alternate regularly or irregularly with those of the second group;

inserting weft fibres (a) to interlace warp fibres of the first group but not of the second group; and inserting weft fibres (b) to interlace warp fibres of the second group but not of the first group.

West fibres (a) may alternate with weft fibres (b) to produce a plain weave or two or more of (a) and/or (b) may be grouped together to produce weaves of other design.

A single shuttle, or other feed system of the weft fibres, or two or more shuttles may be provided, for example one for each layer or ply of fabric.

The result of this is to produce two layers or plies of woven fabric, one above the other. Since a hollow article rather than two unconnected lengths of fabric is required, the weft fibres (a) and the weft fibres (b) may both interlace a certain number of warp fibres at either edge of the above-mentioned zone. Alternatively, or additionally, a knitted stitch may be provided joining together the longitudinal edges of the fabric, as will result for example from use of a needle insertion narrow fabric loom. A further technique, applicable to the use of a shuttle loom, is to use a continuous weft by circular weaving. The number of warp fibres that constitute the first and second groups is made to vary across the warp direction as weaving proceeds such that the hollow becomes angular or branched, if required. The result of such a variation may be to make an angle or branch in the plane of the fabric. Alternatively, or additionally, the number of groups of fibres constituting the zone may be made to change, for example from two to three (or three to two) as weaving progresses thereby causing the number of layers of fabric to increase from two to three. The result of this is the production of a generally blind, hollow branch-off in the thickness of the fabric. The number of layers of fabric may be four (or more) thereby producing two hollow regions in the thickness of the fabric which are separable. Four layers will require two edge joins and this may be done using, for example, a narrow fabric needle loom having two weft insertion needles and associated knitting needles at the edges.

The splitting of the first and second (and optionally other) groups was said above to be at least notional. These groups may in fact be split such that one group is held above the other on the loom. Then, when a weft fibre is about to be inserted, the appropriate group is brought into alignment with the weft fibre, and warp fibres of that group are then lifted, depressed or unmoved as appropriate to produce the desired weave pattern in that group. A loom could of course be used that could insert weft fibres at different positions corresponding to the split first and second groups. We prefer, however, that the splitting is indeed notional. By this we mean that the first and second groups are merely classifications and that they are never physically separated all of one group from all of the other group. Weaving could proceed as follows. At first all of the warp fibres (those in the above-mentioned zone and those of a border either side of the zone) are mutually level. When a weft insertion is to be made into the first group, all of the second group and certain of the first group (every other warp in the case of a plain weave etc.) and certain of the border fibres are lifted. The next weft insertion may also be for the first group, in which case the second group of warp fibres would remain lifted but a different set of first group and border fibres would be lifted. The next weft insertion may be for the second group in which case all of the first group and certain of the second group and border fibres would be lifted.

If this general process were continued, a weave incorporating a cylindrical hollow region would result.

However, if as mentioned above, the size of the two groups which effectively remain distinct is altered as weaving progresses then a hollow region bound by edges oblique to the warp direction will result. In this way an angular (which includes a curved) hollow region can be made. Also a branched hollow region can be made by increasing the width of the zone and at some stage causing weft fibres to join the first and second groups together in the middle of the zone, thus breaking the zone into two zones which may move steadily apart as weaving progresses. This would produce a branch-off having a Y shape.

So far nothing has been said about the weave design except as regards the localized provision of two or more layers of fabric which become one layer outside a specified zone. Any suitable weave may be employed, for example plain, matt (or basket), twill, broken twill, satin, sateen, leno, hop sack, sack and various weave combinations, in single or mutliple ply weaves. The weave design may be uniform over the whole fabric or different weave designs may be employed at different parts, for example over the zone and at the borders. An advantage of any of these weaves is that by employing different fibres as the warp and weft, or by employing zones of different fibres as each of the warp and weft, a hollow article with anisotropic or localized properties may be produced. The weave density and fibre thickness will depend on the intended use of the hollow article. For a typical screening application we prefer for each ply recoverable picks of from 0.1-1.0 mm, especially about 0.3 mm (monofilament diameters) and from 2-24, especially 4-16, more especially 6-12 picks/cm. The warp is preferably of a conductive material, for example about 32 awg wire at 20-40, especially about 28 ends/cm. In general, a broad range of 6-120 ends/cm will cover most situations.

Particularly where the hollow article is to be used for screening, it may be desirable to increase the weft density (in the case of a conductive warp) to reduce the extent of opening up of the warp fibres on installation. It may also be desirable to increase the amount of conductive (or other) material by employing multi-plies instead of a single ply as each layer of the fabric. This will allow greater recovery for a given quantity of non-recoverable conductive material.

It may be particularly desirable to produce a hollow article with substantially undirectional dimensional recoverability, particularly where the hollow comprises generally cylindrical parts whose length remains constant on circumferential shrinkage. This may be achieved by employing a dimensionally-stable warp and a dimensionally-recoverable weft. Where the hollow article has a branch that runs obliquely to the warp direction, such as a Y-piece has, then in general recovery of the oblique arms may have a longitudinal component and a circumferential component. The unwanted recovery can be quite small especially if the angle between the arms is small and it can be localized by employing short oblique arms followed by extensions in the warp direction.

One way of ensuring that recovery is substantially only circumferential in a branching hollow region, is to design the hollow regions only in the warp direction and weft direction (ie not oblique), these regions being joined by right angle bends. The hollow region running along the warp direction can be circumferentially recoverable by using recoverable fibres only in the weft direction when the hollow region is to run in the weft direction (the technique described above for making the hollow region still applies, only the relative width and length being different) a dimensionally stable weft may be used, and recoverable warp fibres brought into play, replacing previously used stable warp fibres unless the hollow fabric is now being generated over a fresh part of the loom. Where recoverable warp fibres replace stable fibres the two types may both be present on the warp beam or other warp feed, arranged alternately in a similar way to that described above for the first and second groups of warp fibres in the zone where the hollow region is generated. It is thus not necessary to stop the loom and change the fibres, and this technique may be employed in the weaving of simple non-hollow sheets. In such a situation the warp fibres may be classified as of three types; firstly non recoverable fibres which may be used to form a border behind and in front of the weft-extending hollow, secondly recoverable fibres that will form, say, the upper layer of the hollow region, and thirdly recoverable fibres that will form the lower layers of the hollow region. These three sets of fibres may alternate regularly or irregularly across the warp beam. This technique may be used to make a fabric having merely different extents of recovery in the warp direction.

The invention therefore further provides a recoverable woven fabric having recovery localized along, or different extents of recovery along, the warp direction.

The term "fibre" as used herein includes filaments e.g. monofilaments or multifilaments, and also staple fibre yarns, tow, wires and tapes. The fabrics preferably employ the heat shrinkable fibres in the form of filaments, especially monofilaments, and particularly cross-linked monofilaments.

Heat-recoverable fibres used in the fabric of the invention preferably have a minimum recovery stress of $10^{-1}$ MPa, more preferably $5 \times 10^{-1}$ and usually at least 1 MPa at a temperature above the transition temperature of the fibres. There is in theory no upper limit of recovery stress, but in practice 200 MPa and more usually 100 MPa is the highest figure normally achievable with polymeric fibres.

The fibres are preferably formed from a polymeric heat-recoverable material. By the recovery temperature of polymeric heat-recoverable materials is meant that tenperature at which the recovery of the polymeric material will go substantially to completion. In general, the recovery temperature will be the crystalline melting transition temperature if the polymer is crystalline or the glass transition temperature if the polymer is amorphous.

The heat-recoverable fibres are preferably formed from a polymeric material that imparts good physical properties and, in particular, good creep resistance to the fibres. Olefin polymers such as polyethylene, and ethylene copolymers, polyvinylidene fluoride, polyamides, polyesters, acrylic polymers and other polymers may be employed and preferably those that are capable of being cross-linked. A particularly preferred polymeric material for the fibres is based on polyethylene average a density of from 0.94 to 0.97 gm/cc, a weight average molecular weight Mw of from $80 \times 10^3$ to $200 \times 10^3$ and a number average molecular weight Mn of from $15 \times 10^3$ to $30 \times 10^3$.

Preferably the recovery temperature of the fibres is 60° C. or more, most preferably from 80° C. to 250° C., such as, for example, 120°-150° C.

We prefer that recoverable fibres used have a recovery percentage (change expressed as a percentage of the old dimension) of at least 30, particularly at least 50, preferably at least 75, especially at least 80, particularly at least 90. Depending on the weave design and other factors, fabric made from recoverable fibres will have a lower recovery percentage than that of its free fibres, and we prefer fabrics of at least 20%, particularly at least 50%, especially at least 60%, most preferably at least 66% recovery. Where the fabric is laminated or otherwise treated to make an impervious or composite structure, recovery will again be reduced and preferred figures are at least 20%, especially at least 40%, preferably at least 50%.

When the fibre is cross-linked by irradiation it is convenient to incorporate the cross-linking step into manufacture of the fibres. The fibre can be extruded, stretched at a temperature below its melting temperature, preferably by an amount of from 800 to 2000%, then subjected to irradiation to effect cross-linking. An alternative way of making the fibre is to extrude the fibre, irradiate to cross-link, then heat the fibre, preferably to above its melting temperature, stretching the fibre, and then cooling the stretched fibre. High density polyethylene fibres are preferably irradiated with a dose of from about 5 to about 35 megarads, preferably from about 5 to about 25 megarads, especially from 10 to about 18 megarads. Usually the gel content of the cross-linked fibre is greater than 20%, preferably greater than 30%, most preferably greater than 40%. In practice, gel contents greater than 90% are not easily achievable. Fibres produced in this way can have a high strength after recovery.

Any of the above-mentioned materials may be used alternatively as non-recoverable fibres, either in a wholly non-recoverable fabric or as a non-recoverable component of a recoverable product. Preferred non-recoverable fibres however, include the following; glass fibres, carbon fibres, wires or other metal fibres, polyesters, polyamides, aromatic polymers such as aromatic polyamides for example Kevlar (trade mark), imides and ceramics, and metallised polymeric fibres. The non-recoverable component may be permanent in the fabric, giving the fabric enhanced strength etc., or it may be present in discrete form only to locate a recoverable component of the weave during manufacture and/or installation.

Where the fabric of the invention is to provide a current path around a substrate, particularly for electromagnetic screening, a conductive material will be required, and it is an advantage of the invention that such conductive material may be provided as an inherent component of the fabric during weaving. Provision of screening etc. will now be discussed in greater detail.

The fibres which provide conductivity may consist entirely of conductive material or may have only a core or a coating or intermediate layer or a dispersion of conductive material. An example of the third of these types is an aluminium or other metal coated glass fibre. The conductive material may be, for example a conductive polymer such as a polymer loaded with carbon black, but will preferably be a metal due to the lower resistivities of metals. The magnetic permeability of the material will be important where screening against magnetic induction is to be provided. These fibres may be single metal strands or multi-strand filaments, either alone or in combination with a metallic or non-metallic core, and may have any cross-sectional shape for example circular or rectangular.

Where a metal is used, it is preferably copper, silver, gold, tin, lead (e.g. a tin/lead solder to produce for example a coalesced layer after heat-recovery), aluminium, nickel or a ferrous metal, and most particularly copper or silver due to their high conductivities, or mumetal (Trade Mark) due to its high permeability. It may be desirable that electrical contact occurs between the conductive fibres at one or more points along their length, in which case the fibres desirably have an enhanced oxidation resistance surface, an example of which is tinned copper. In addition, it has been observed that the provision of a surface layer of tin significantly improves high frequency screening effectiveness (eg above about 1 MHz) possibly due to the high elongation to break of tin which is therefore capable of bridging small cracks which may otherwise occur. This problem is unlikely to be noticed in the article of the present invention due to the high flexibility of fabrics, but it may be a desirable feature when electrical components of hightly irregular shape are to be screened, or when moving parts or parts subject to vibration or sharp edges are to be screened.

The skilled man will be able to determine the particular weave design that is best from the point of view of screening. We have found that the weave design is not critical within certain limits, but that some variation in screening performance results from the size and density of both the conductive and non-conductive fibres. A quantity which may be considered here is the optical coverage of the fabric by the conductive material, which simply means the percentage of the area of the fabric which in plan view is occupied by conductive material. For high optical coverage, the screening performance varies little with optical coverage but is dependant on the configuration of the fibres. In general, the optical coverage will increase as the fabric shrinks and the following preferred values should be taken as applying after shrinkage: a value of at least 50% is preferred, especially at least 75%, more especially at least 85%. Where the value is initially ;low, a significant improvement in screening performance may be noticed on recovery. In such a situation, the initial size may be chosen such that a significant extent of recovery is required for complete installation.

Where the fabric is to be used in significant length in a direction perpendicular to the direction of recovery (as is the case for example of a long radially recoverable sleeve for cable screening) it may be desirable that either the conductive fibres do not all run parallel to the length of the hollow or that some electrical connection is provided between adjacent conductive fibres at repeated spacings along the length of the sleeve. The reason for this is that the conductive fibres will otherwise act as an aerial for radiation of a certain frequency, the value of that frequency depending on the length of the electrically independant conductive fibres. For the frequencies one is generally concerned with this may become a problem where the hollow has a length of about 1 meter, or multiples thereof. A preferred method of overcoming or alleviating this problem is to arrange conductive fibres in a shallow helical path around the circumference of the sleeve.

The means for electrically terminating the conductive material will now be considered. Where an electrical component is to be screened it is in general necessary completely to enclose that component and any other component electrically connected thereto by a screen. In general, the fabric of the invention will provide only part of the total screen, and some form of housing or connector shell or further cable screen will also be involved. Thus, some means has to be provided to provide electrical continuity between the conductive component of the present fabric and a continuation of the screen. In some circumstances a single piece of fabric may be used to provide all the screening that is required, and the means for terminating will therefore simply connect conductive material of one part of the fabric to that of another part of the fabric. The present claims cover this possibility. The means for terminating may terminate one or some only of the conductive fibres (the conductive fibres being in electrical contact with each other elsewhere) or it may terminate all of them. It is preferred that the means for terminating carries out both functions of connecting the conductive fibres to the continuation of the screen and also of connecting the fibres together.

Three broad types of means of terminating may be described: mechanical, recoverable and termination by means of a sealing material or other coating.

The mechanical means may be a clamp, for example a jubilee clip or other type of hose clamp which, in a preferred embodiment, serves to engage a portion of the fabric to an underlying member. The clamp is preferably made from a conductive material, such as a metal. Such a clamp may serve also to provide a mechanical join between the fabric and the continuation of the screen, thereby providing strain relief by means of the fabric across the component to be screened.

A recoverable means for terminating may comprise a recoverable driver sleeve, ring, or other means, which causes the fabric to engage the continuation of the screen. Such an additional recoverable sleeve will in general be required because the force exerted by a unit area of the recoverable fabric itself may not be great enough to ensure good electrical contact. The reason for this is that in order to achieve good screening a a high quantity of conductive material is desirable and in the case of single layer weaves, this generally will be provided at the expense of the quantity of recoverable material. The recoverable fibres may therefore be spaced too far apart.

A sealing material may provide the termination by improving electrical conduction between the conductive fibres and the continuation of the screen. In this case, the recovery force exerted by the fabric may be sufficient. The sealing material may be uniformly positioned over the surface of the fabric or it may be localized, for example at ends of the fabric where connection to a back-shell etc is to be made. Suitable sealing materials include solder (by which we mean any metal or alloy of suitably low melting point, such as 80°–250 C.), conductive sealants for example mastics, or conductive adhesives for example heat-activatable adhesives. Solder may be applied dispersed in a flux, preferably as a formulation having the consistency of a cream, in which case it can be smeared or otherwise applied around the underlying substrate, either directly or on a separate carrier layer. A thinner layer, such as a conductive paint, may additionally or alternatively be used. The solder or adhesive may be incorporated into the fabric for example by weaving or knitting fibres of solder or adhesive, or it may be applied by a coating technique (such as dipping) or it may, at least initially, be a discrete component such as a solder or adhesive ring or a carrier such as a fabric strip embedded in solder or adhesive. Alternatively it may initially be applied to the substrate in another form such as a cream as mentioned above. The solder or adhesive may penetrate the interstices of the fabric after installation, and if desired also before installation. A preferred way of rendering a sealant or an adhesive conductive is by loading it with a metal, for example silver. The sealing material is preferably heat-activatable by softening or melting so that its contact with the fabric increases as the fabric recovers. Alternatively, or additionally the sealing material may comprise reactive components, and may be provided as a component of the fabric. Where the fabric is heat-recoverable, a single heating step preferably causes both recovery of the fabric and activation of the sealing material. The difference between the recovery temperature and activation temperature is preferably 20 C. or less, more preferably 10 C. or less. Where high melting point solders (or adhesives) are desirable a polymer such as a nylon or polyester having a high recovery temperature may be chosen for the recoverable fibres.

We now turn to a consideration of the electrical or magnetic properties desirable in the fabric. They will clearly depend on the intended use of the fabric. Although the invention relates to any purpose for which series of conductors are positioned around an electrical component to provide a conductive path of specific configuration, the following uses may be mentioned:

initial screening of cables, especially multi-core cables and flat cables; repair to existing cable screens; screening of cable branch-offs, for example in harnesses; screening of cable splices; screening of cable connectors; providing cable screening and armouring; providing lightning strike protection; providing current return paths; and providing intentional induction of current.

Where a simple current path is required the primary consideration will be the total resistance or impedance of the conductive fibres and the means for terminating.

Where, however, protection against interference is to be provided, the nature of the interference and a way of measuring the extent of protection must be considered. The three basic mechanisms of leakage associated with cables and other electrical components are electrostatic induction, magnetic induction, and electromagnetic induction. The main source of interference, at high frequencies at least, is electromagnetic induction, and the ability of a recoverable fabric to screen in this respect will be discussed. The reader is directed to a document entitled "Optimised and Superscreened Cables" published by Raychem Ltd, Faraday Road, Dorcan, Swindon U.K. which describes a known technique for assessing screening performance. It is now generally accepted that screening performance may be measured by surface transfer impedance (ZT). In terms of a cable, this relates the open circuit voltage generated inside the cable sheath to the current flowing on the outside. The unit of ZT is ohm/m, and the voltage coupling is therefore length dependant, a long cable exhibiting more leakage than a short one. The value of ZT will be frequency dependant, and a value at 30 MHz will give a particularly useful indication of performance.

The following test method is an adaptation of I.E.C. 96 and B.S. 2316. A tube of the fabric is recovered about a length of a tubular dielectric material having a central conductor along its length. A high frequency current is passed along the conductive fibre component of the fabric via the chosen means for electrically terminating the fibres. The voltage induced in the central conductor is measured after amplifying it in a low noise amplifier. Such a set-up mirrors the effect of incident electromagnetic radiation on the fabric.

The results of this measurement, expressed in terms of surface transfer impedance (ZT), may be related to screening effectiveness (SE) in decibels by the following expression $$SE(dB) = 20 \log 10 ZT/ZO + 20 \log (2r/L)$$

Where
ZT is the recorded surface transfer impedance (ohms)
ZO is the impedance of free space (337 ohms)
r is the radius of the fabric tube (meters)
L is the length of the tube (meters).

We prefer that the surface transfer impedance measured in this way is 5 ohm/m or less, preferably 500 mohm/m or less, more preferably 60 mohm/m or less especially 40 mohm/m or less, particularly 10 mohm/m or less.

These values preferably apply at 30 MHz, more preferably over a range 1 MHz–50 MHz especially 10 KHz–100 MHz, more especially 1 KHz–1 GHz.

In general, the value of ZT does not vary unacceptably with weave design so long as the optical coverage is at least say 50% for a given conductive fibre diameter in a fabric of given picks per cm and ends per cm and the resistivity of the conductive fibres is preferably 1 ohm cm or less, especially $2 \times 10^{-3}$ ohmcm or less, or more especially $10^{-4}$ ohmcm or less. The diameter of the conductive fibres, where circular, for most applications is preferably 0.02–5 mm, more preferably 0.1–1 mm, and the diameter of the recoverable fibre(s) before recovery is preferably 0.02–5 mm, more preferably 0.1–1 mm. Where multi-filament fibres are used, these figures refer to the overall size of the multifilament. A greater amount of conductive material with less separation between adjacent conductive fibres (viewed in plan and/or in end elevation) can be realized if the conductive fibres have a high degree of crimp and the recoverable fibres have a low degree of crimp. The high degree of crimp means that a greater length of conductive fibre is required, and additionally the continually changing direction of the crimped metal fibres also has a beneficial effect. The lack of crimp in the recoverable fibres allows the conductive fibres to move close together, preferably to allow electrical contact when the fabric recovers. These beneficial effects are noticed when the recoverable fibres have substantially no crimp and when the conductive fibres have at least 1%, especially at least 3%, particularly at least 5% crimp. These values will depend on the weave design and on the size of the fibres etc., but they may regarded as typical for preferred fabrics. The crimp is measured as the difference in the length of a fibre in the fabric and its length if it were removed from the fabric and straightened under a specific tension, expressed as a percentage of its length in the fabric. Better screening performance has been noted with conductive fibres as longitudinal warp running along the length of the hollow, and recoverable fibres as circumferential weft. Here, crimp in the longitudinal (conductive) fibres is beneficial for an additional reason: some longitudinal bending ability of the fabric tube may be desirable and crimp may allow such bending without fibre damage occurring. For this purpose at least 5%, particularly at least 8%, especially at least 10% crimp may be provided. Improved screening results after recovery, particularly after only partial recovery, have also been noted when the fabric is provided with a polymeric material as a laminate, and this is thought to be due to a more uniform recovery. Such a laminate may take the form of an external environmentally protecting jacket or as an internal layer for improved sealing or for electrical insulation. Where such an insulating layer is provided, the article of the invention could be used directly to screen a bare conductor. The laminate may be recoverable, but where it is thin it may be able to be deformed under the recovery forces of the fabric, especially if it softens under the heat required for heat-recovery. A thickness of laminate of from 0.1–10 mm is preferred. In some circumstances the laminating material may be cross-linked to improve its high temperature performance, or to improve its ability to recover, or its stability during installation. A laminating material may be provided on both sides of the fabric, and it may be a mere coating or it may enter the interstices of the fabric.

Fabric for environmental sealing will preferably be substantially impervious and this may be achieved by tightness of weave (optionally aided by recovery), by coating the fabric, or by incorporating in the fabric a component that may be made to melt or soften, thereby forming optionally in conjunction with another component a continuous layer. This third possibility allows an adhesive or other sealing material to be incorporated at precise locations on the hollow fabric and at precise thicknesses. Internal coating with adhesive of a hollow moulded part is, by contrast, rather difficult. It is possible for fibres comprising a sealing material to be incorporated as part of the weave, for example as at least part of the warp in a fabric with recoverable weft. The weave design may be such that most of the sealing material appears on the inside of the hollow fabric, and satins or sateens may for example be used for this purpose. An alternative technique is to use multi-layer or multi-ply weaves using for example a sealing material for the fibres of the internal layers. For example a hollow article could comprise four-ply weave, the internal two layers being of hot-melt fibres and the external two layers comprising recoverable fibres and, say, conductive fibres for screening.

We prefer that the sealing material be heat-activatable, for example by softening or melting or by reaction of two or more components thereof. In this way, the hollow fabric may be installed over the substrate to be protected, and then heated to complete the seal or make a bond. The fabric is preferably also heat-recoverable in order that it be made to engage the substrate after approximate installation. Where a heat-activatable sealing material is used in conjunction with heat-recoverability, we prefer that the activation and recovery temperatures be close, preferably within 30 C., more preferably within 10 C. of each other, in order that a single heating step results in a simple installation.

Where the fabric is to be heated for heat-recovery, for heat-activation of a sealing material or for other purposes, a separate heat source such as a torch or hot-air gun may be used, or the fabric may be self-heating. Self-heating is preferably by means of electricity, and one or more heating conductors may be incorporated into the fabric during weaving, may be inserted after weaving or may form part of a structure otherwise attached to the fabric. Most preferably the heating conductors comprise conductive polymeric fibres, which may, but need not be, recoverable, woven as part of the fabric. The conductive polymer used may have a positive temperature coefficient of resistance by means of which the heater is self-regulating with respect to temperature.

Although incorporation of meltable or softenable fibres is a preferred technique for achieving impermeability in the fabric, it may in some instances be desirable to laminate the fabric with a layer of material. The meltable or softenable fibres or lamination preferably comprises polyvinyl chloride, ethylene/vinyl acetate copolymers, ethylene/ethyl acrylate copolymers, polyethylene including the low density, high density and linear low density grades, polypropylene, polybutylene, polyesters, polyamides, polyetheramides, perfluoroethylene/ethylene copolymers, polyvinylidene fluoride, acrylonitrile butadiene styrene block copolymers, acrylic elastomers, high vinyl acetate copolymers with ethylene, polynorbornene, polyurethanes or silicone elastomers.

Where the fabric is recoverable and has such a component which renders it impermeable, it will preferably comprise a recoverable composite structure that is recoverable by virtue of a recoverable fibre component thereof. Thus, one of the fabric components may no longer be discrete, but rather form a continuum or matrix of the composite material. It is desirable of course that the matrix allow the recoverable fibres to recover sufficiently to cause the desired configurational change in the composite material, which should retain its impermeability. If the matrix is too weak at the recovery temperature of the fibres then it will drip or flow excessively causing loss of integrity, whereas if it retains too high a rigidity recovery will be inhibited.

The composite structure is preferably produced by a method which comprises:

(a) providing a heat-recoverable fabric comprising fibres that will recover when heated, the fibres having a recovery stress (Y) of at least $5 \times 10^2$ MPa at a temperature above their recovery temperature; and (b) applying as a matrix to said fabric an amount of a polymeric material having an elongation/temperature profile such that there exists a temperature (T), which is at or above the recovery temperature of the fibres, at which temperature the polymeric material has an elongation to break of greater than 20% and 20% secant modulus (X) of at least $10^{-2}$ MPa (measured at a strain rate of 300% per minute), such that at temperature (T) the inequality (1) is satisfied.

$$\frac{X}{Y} \frac{(1-R)}{R}$$

is less than one; where R is the mean effective volume fraction of heat recoverable fibres in the composite structure along a given direction based on the total volume of the composite structure, or relevant portion thereof.

In most forms of composite structure relevant here the polymer matrix will become soft at temperatures below the recovery temperature of the heat-recoverable fibres so that the temperature (T) at which the matrix material has the required elongation and secant modulus and at which the above inequality is satisfied will be the same as the recovery temperature of the fibres. The invention includes, however, those cases in which a rigid matrix material holds out the fibres against recovery over a temperature range above the recovery temperature of the fibres and then softens so that the fibres can recover.

The above relationship will not of course be relevant in the case of a fabric which forms a composite structure only during or after recovery required for installation. In this case the fibre component that later provides impermeability will not offer significant resistance to recovery at least in the early stages of recovery.

Another instance where a composite structure may be produced is where one component of the initial fabric is of a metal (or other conductive material) for screening etc. and the other component is a sealing material which coalesces for example on heating. The result is a branched or angular hollow article comprising a matrix with metal fibres therein.

BRIEF DESCRIPTION OF THE DRAWINGS

The invention is further illustrated by the accompanying drawings, in which

FIG. 9 represents a 3/3 tubular twill;
FIG. 10 represents a two-layered tubular weave.

DETAILED DESCRIPTION OF THE INVENTION

Figure 1:
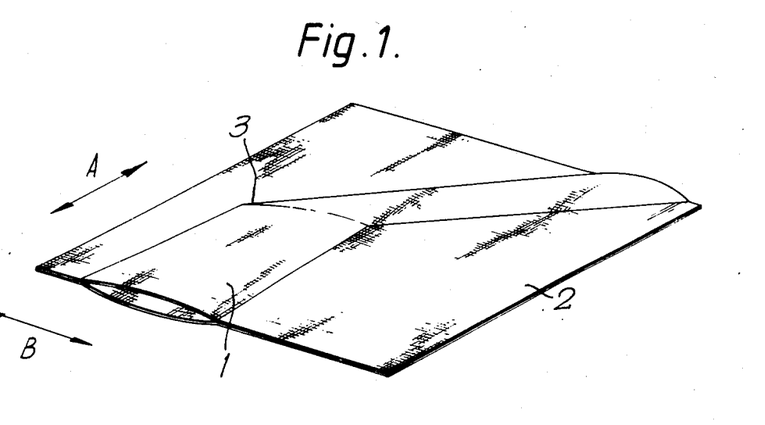
FIGS. 1 and 2 show an angular hollow woven article.
Figure 2:
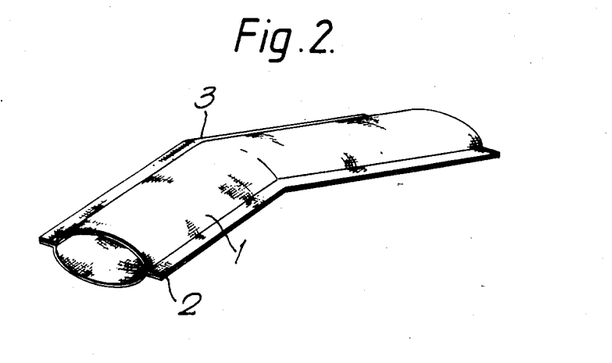

FIG. 1 shows a fabric having a hollow region 1 woven therein. The hollow region is bordered by edge regions 2 and is angled at the position marked 3. The edge regions 2 may be trimmed as in FIG. 2 and we have surprisingly found that quite close trimming can be made without the two layers of fabric separating even where circumferential recoverability is provided. In certain instances, however, it may be desirable to provide extra strength in the edge regions 2 and this may be done for example by increasing their size, by the use of adhesives, or by sewing or stapling. As mentioned above, a hollow article can be made by incorporating a knitted stitch into the weave at the edges of the hollow region, and this reduces the edge region 2 to the size of a single stitch if necessary. This will in general be the result of needle weft insertion on a narrow fabric loom. The use of a continuous weft by circular shuttle weaving of course eliminates the edge region 2 altogether. An article having an edge region 2 may be turned inside-out to conceal the edge regions.

Figure 3:
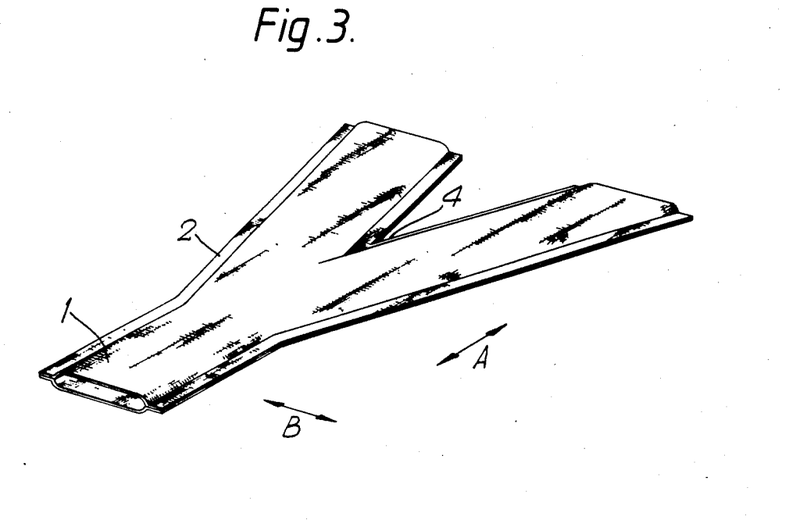
FIGS. 3 to 6 show a branched hollow woven article.

FIG. 3 shows a hollow in the form of a Y-shaped branch off 4 in the plane of the fabric. The warp direction is indicated as A and the weft direction as B. It can be seen that if a recoverable weft is provided, the base of the Y will be recoverable only circumferentially, whereas the oblique arms of the Y will have a small component also of longitudinal recovery. The edge regions 2 are preferably avoided, for example by a technique as described above. The edge regions 4 of such a multi-branched fabric can be avoided by special techniques, for example use of two or more needles on a needle insertion loom, or two or more shuttles on a shuttles loom.

Figure 4:
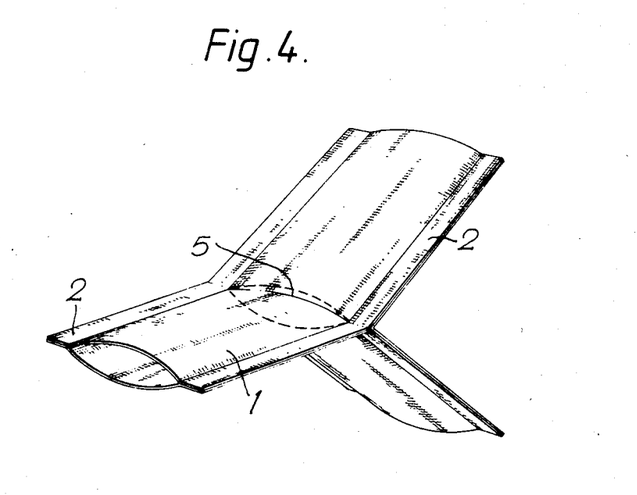

A hollow branched in the thickness of the fabric is shown in FIG. 4. The branch occurs at region 5 due to the generation at that region of four rather than two thicknesses of fabric in the centre zone of the warp fibres, and the generation of two rather than one thickness of edge regions 2. The newly generated pair of hollows will generally be blind at the branch region, unless special techniques are used to avoid this. Alternatively the closed ends may simply be opened by parting the fibres after weaving. A branch-off made in this way can be very flexible allowing the arms to move apart to accomodate various configurations of substrates to be encapsulated. Where separation of the arms of the branch-off is not required, it may be sufficient at region 5 to generate three thicknesses of fabric and continue with a single thickness of edge regions 2. As before, the edge regions are preferably avoided.

Figure 5:
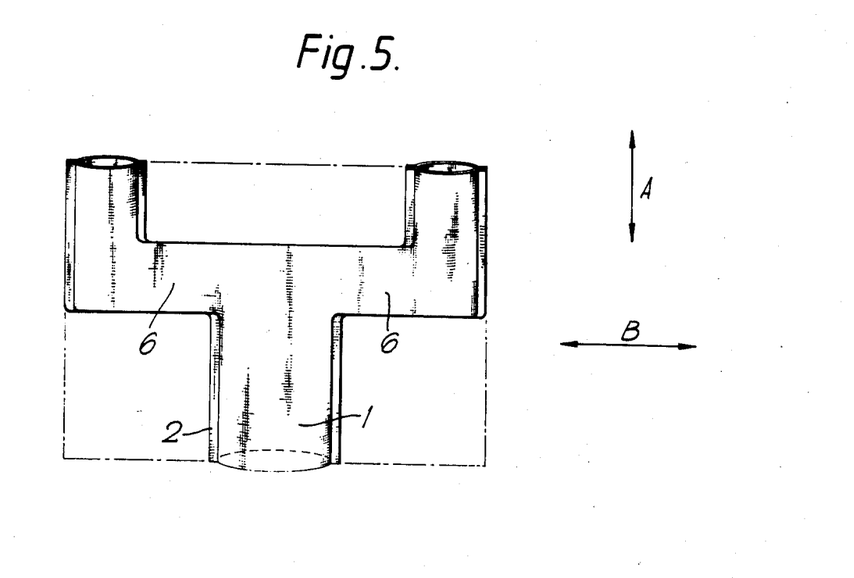

FIG. 5 illustrates a branched hollow fabric having hollow regions 6 running in the weft direction B. Such hollow regions may simply be regarded as wide hollow regions running along the warp direction but only for a short distance. Thus, the method of construction may be as described above. Circumferential recovery of the regions 6 requires a recoverable warp, whereas a dimensionally stable warp may be required where the hollow regions extend in the warp direction in order to avoid longitudinal recovery there. The warp feed may simply be arranged with recoverable fibres and stable fibres at the appropriate positions, and if the edge region shown by the dotted line is trimmed away or avoided substantially uniform recovery without buckling will occur. In any of these branched fabrics it may be desirable to increase fibre density in the branch-off region, for example by incorporating a flat woven piece. This may be desirable to increase optical coverage of conductive fibres in screening application. Such branching, especially where curable fibres are incorporated, may be used to produce structural articles, or couplings between other articles, for example allowing passage of fluid. After curing the article may become substantially rigid.

In certain more complicated designs warp recovery may be required at a certain position across the weft, but localized in the warp direction. This may be achieved by changing the warp fibres during weaving either by terminating one warp feed and substituting it with another. Alternatively, recoverable and stable warp fibres may both be fed and the relevant type selectively incorporated into the weave at the correct region. This technique, which was mentioned above, may be analogous to the use of first and second groups of fibres that constitute the zone of fabric where the multiple layers are generated.

Figure 6:
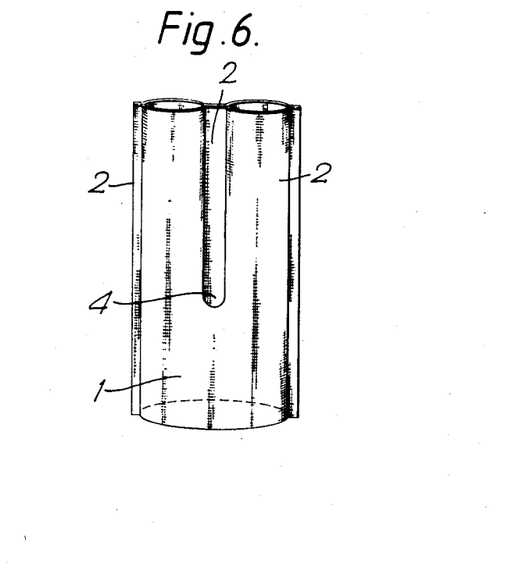

The branch-off 4 shown in FIG. 6 has parallel, arms generally with a simple seam between the branches and is well suited for production on a narrow fabric loom. More than two branches for example three, four or more, up to say ten, may be provided. The branch regions may be separated from each other laterally.

Figure 7A:
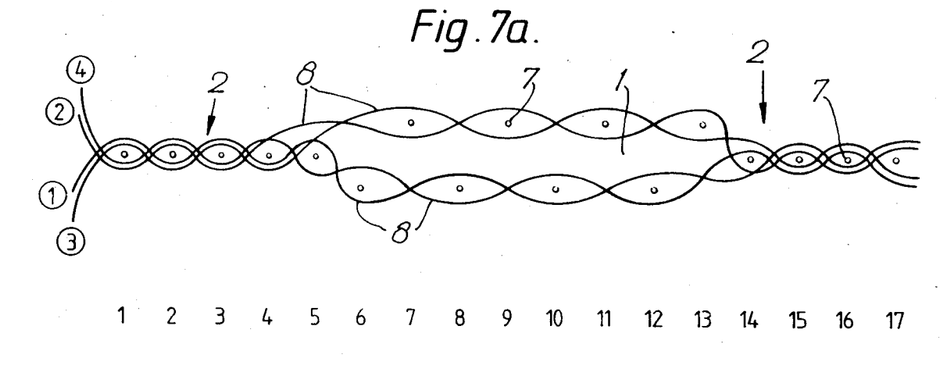
FIG. 7a shows a section through the warp of a hollow woven fabric.

FIG. 7a is a section across the warp showing four weft insertions. The warp ends are labelled 7 and the picks 8. The figure shows only seventeen ends, of which those numbered 6–13 form a hollow region 1, and those numbered 1–5 and 14–17 form edge regions 2. In practise, a fabric would be made from many more ends.

The encircled numbers 1–4 at the left-hand side of the drawing indicate one of several possible orders of weft insertions. The fifth, sixth, and subsequent insertions would follow the first and second etc., and be hidden behind them. The weave pattern illustrated is a plain weave for both the edge regions 2 and both thicknesses of the fabric at the hollow region 1. This need not be so and other weave designs may be used, which may be the same or different for different parts of the fabric.

Figure 7B:
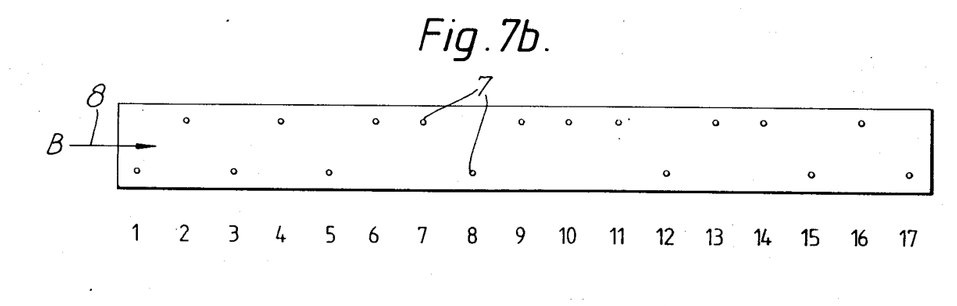
FIG. 7b shows the arrangement of warp fibres at a particular weft insertion.

The warp ends 7 are shown in FIG. 7b in position ready for insertion of a weft insertion 8 as shown as encircled 1 of FIG. 7a. Ends, 2,4,6,7,9,10,11,13,14 and 16 are shown lifted to produce a plain weave across the fabric.

Figure 8:
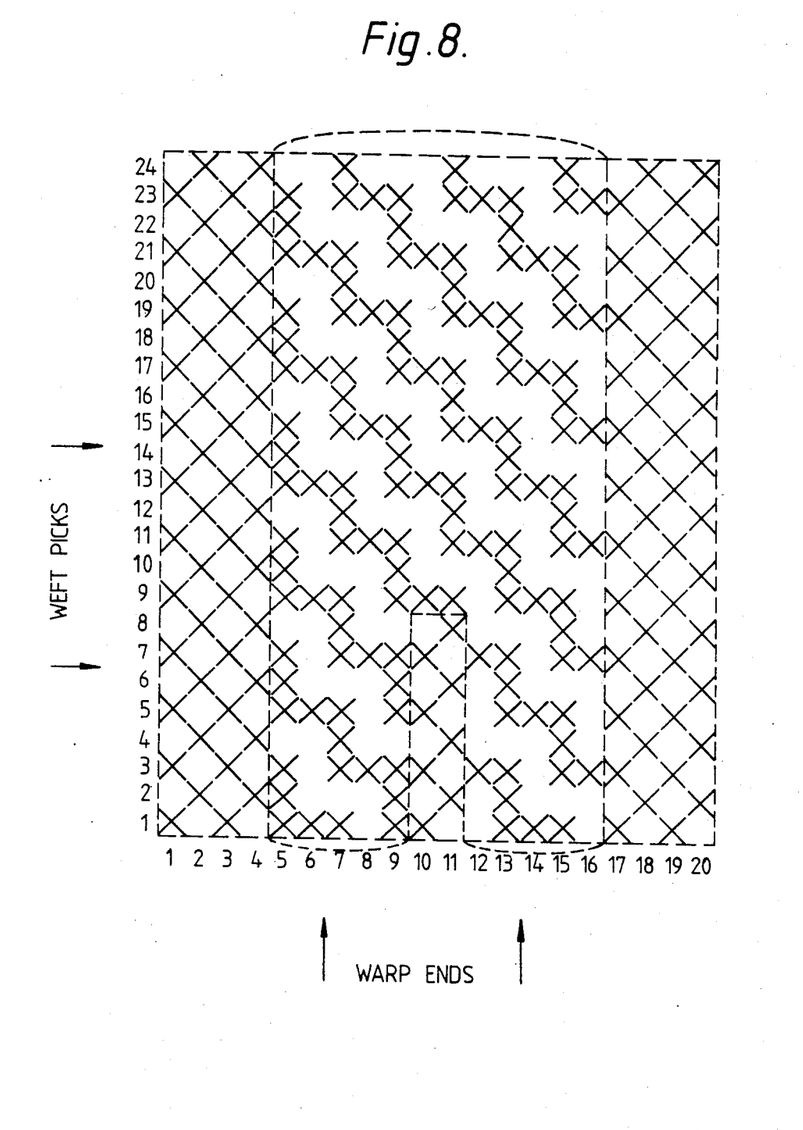
FIG. 8 is a program for a loom for production of a branched tubular weave.

FIG. 8 is primarily a schematic program to cause a loom to produce a hollow branch-off of the type shown in FIG. 6. Each X in the Figure tells the machine to lift a warp end. Thus where there an X, a weft fibre passes under a warp fibre and where there is no X a weft fibre passes over a warp fibre. The vertical columns 1–20 indicate twenty warp ends. The horizontal rows 1–24 indicate twenty four weft insertions.

As in FIG. 7, the number of ends illustrated is much smaller than would generally be used in practice.

The weave generated by the program of FIG. 8 is similar to that shown in FIG. 7a in that it is a plain weave over all regions. The Figure indicates that the first weft insertion passes under warp end 1, over end 2, under end 3 etc, since each "X" representing the warp lifted.

The hollow region generated has been indicated by a dotted line superimposed over the Xs that constitute the program. For the first eight weft insertions two hollow regions are produced, bordered by two edge regions. At weft 9, the hollow branches become a single hollow region.

The process of FIG. 8 involves four different patterns of weft insertions in the main body and two more in the branch which repeat, in a similar fashion to that shown in FIG. 7a. This is only one possibility, and other weave designs could of course be used.

Figure 9A:
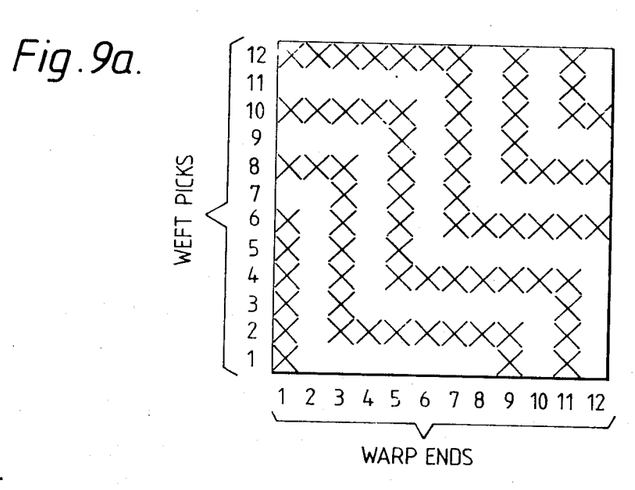
FIG. 9A is the weave program for a 3/3 tubular twill.
Figure 9B:
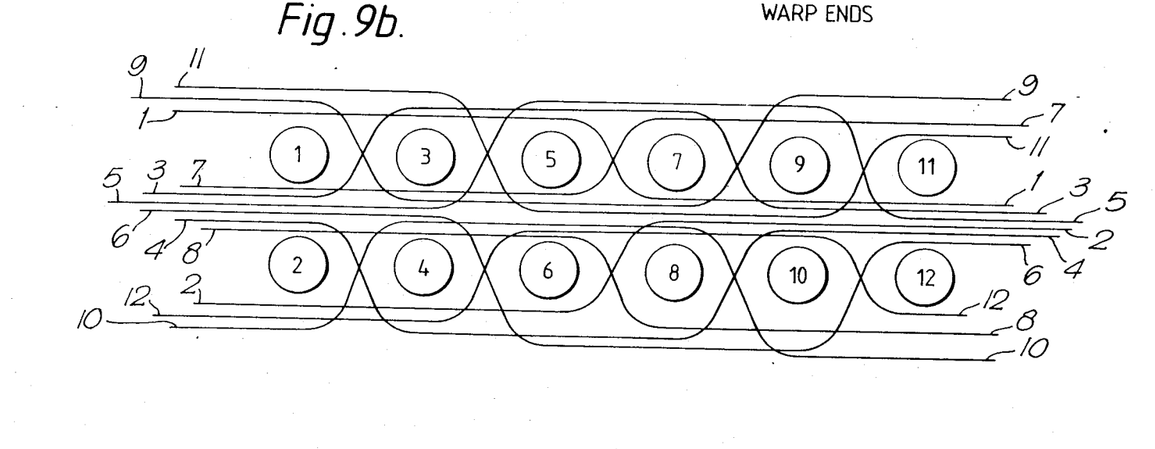
FIG. 9B is a weft cross-section for a 3/3 tubular twill.

FIG. 9a is a weave program for a 3/3 tubular twill showing one weave repeat, the weft cross-section of which is shown in FIG. 9b. As before, an "X" in the weave program represents a warp lifted. In the weft cross-section the numbered circles show the weft fibres, the odd numbers forming an upper ply, and the even number forming a lower ply. The transverse fibres are numbered 1–12, and the numbers on FIG. 9a correspond to those shown in FIG. 9b.

A longer float length, such as in the 3/3 twill illustrated, results in a more flexible hollow woven fabric. This is an advantage where the fabric has to encapsulate irregular substrates such as for cable harnessing, especially where movement will occur in use. We prefer the float to be at least 3 (a float of 3 being illustrated in FIG. 9), more preferably at least 5.

Flexibility of this type and other weaves may be retained by ensuring that on installation of a recoverable fabric, some recovery for example 50–75% of the total available recovery remains.

Figure 10A:
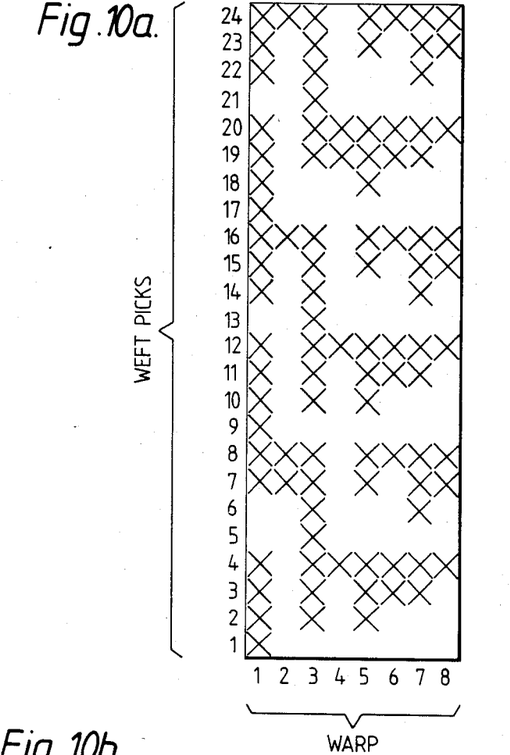
FIG. 10A shows the weave program for a two layer tubular weave.
Figure 10B:
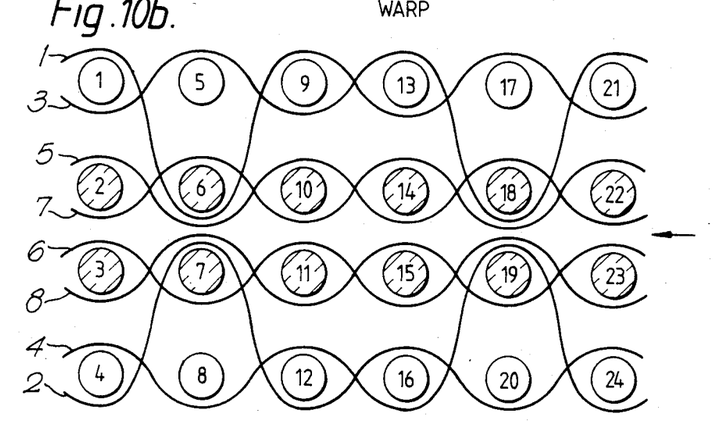
FIG. 10B shows the weft cross-section for a two layer tubular weave.

A two layered tubular weave (ie. a total of four plies) is shown in FIG. 10. FIG. 10a shows a weave program and FIG. 10b is a cross-section through the weft showing one weave repeat. Such a two layered structure may be used to combine several functions such as recovery, environmental sealing, mechanical strength and adhesion. These different properties may be provided in separate layers.

For example, FIG. 10b could represent a hollow article of high strength for environmental sealing in the following way. The cross-hatched encircled numbers (2,6,10,14,18,22,3,7,11,15,19,23) could be an adhesive weft, the plain encircled numbers (1,5,9,13,17,21,4,8,12,16,20,24) could represent HDPE recoverable weft, the warp fibres 1,3,4,2 could be strength fibres such as Kevlar (trade mark), and the warp fibres 5,7,6,8 could be adhesive fibres. The resulting article would have weft recovery (preferably circumferential in a tubular structure), longitudinal strength, and an internal adhesive layer. An article for screening could employ a conductive fibre for example metal as warp 1,3,4,2.

Figure 11:
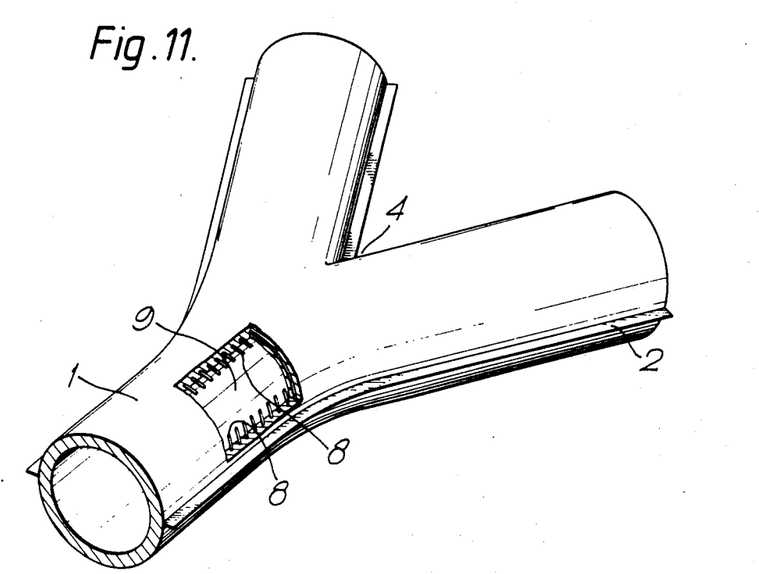
FIG. 11 illustrates a branched hollow structure formed from a composite material.

FIG. 11 shows a composite structure formed from a fabric having a hollow woven therein. Circumferential recovery results from recoverable fibres 8 (preferably weft fibres) which can be seen in cut-away region 9. The other fibre component has coalesced to form a matrix or continuum.

The fibres that remain in a composite structure such as that of FIG. 11 need not be provided to give recovery, but could be for some other purpose. For example metal or other conductive fibres may be provided for screening or other purposes. Recoverable fibres and other fibres may remain to produce a recoverable article for screening. For example, circumferential recoverable fibres could be provided with longitudinal screening fibres. These two groups need not be interlaced if a matrix were provided. The matrix could result from a third fibrous component which originally interlaced with the other two.

Figure 12:
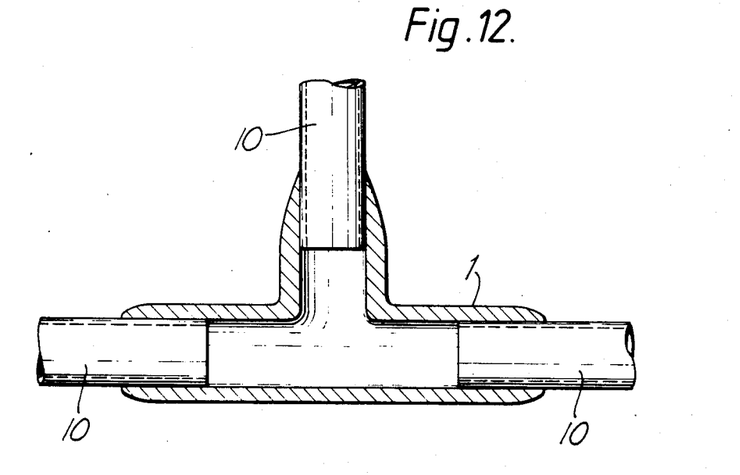
FIG. 12 shows a hollow T piece providing a connection between conduits.

FIG. 12 shows a hollow article 1 used to join mechanically the three substrates 10, for example to allow fluid transmission between pipes.

Figure 13:
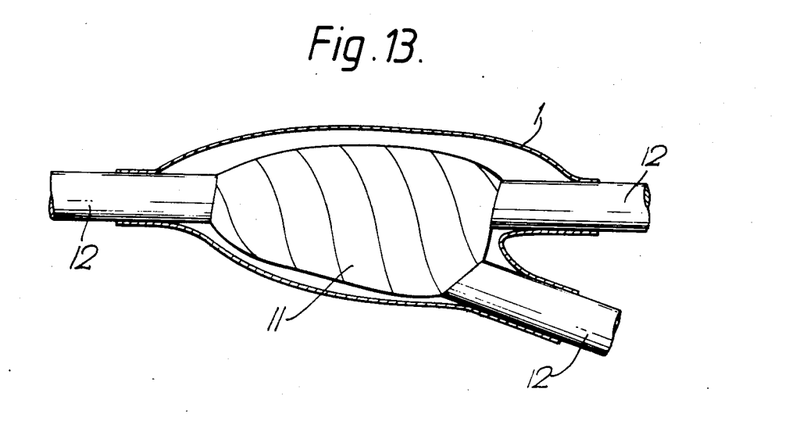
FIG. 13 shows an encapsulated cable splice.

In FIG. 13 a hollow article 1 encapsulates a splice bundle 11 between telecommunications cables 12. Such an article may also be used for cable harnessing, but a large central region will not then be required due to the absence of a bulky cable splice. The fabric constituting the article 1 may have zones of different recovery ratios or strengths. For example the centre region of the article may be non-recoverable and the end regions recoverable.

Figure 14:
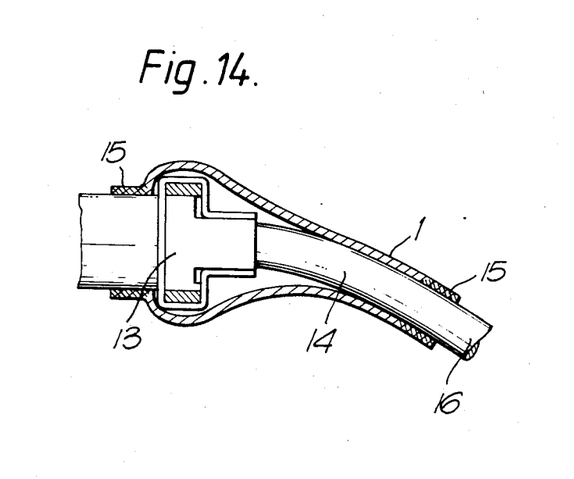
FIG. 14 shows an encapsulated back-shell.

FIG. 14 shows a hollow article 1 comprising a woven fabric having conductive fibres running longitudinally and recovered fibres running circumferentially. The article 1 provides electromagnetic screening over a backshell 13 where a cable 14 is terminated. Means 15, for example a clamp or solder, is provided for terminating the conductive component of the article 1 to the backshell 13 and to the adjacent screen 16 of the cable 14.

I claim:

1. A heat-activatable article comprising a fabric having an angled or branched hollow region woven therein.

2. An article according to claim 1, in which the fabric comprises heat-recoverable fibres.

3. An article according to claim 1, in which the fabric comprises conductive fibres by means of which the fabric exhibits electromagnetic screening.

4. An article according to claim 3, in which the fabric comprises heat-activatable fibres such that the fabric becomes impermeable or is capable of bonding to a substrate on heating or becomes substantially rigid.

5. A method of making a heat-activatable article comprising a fabric having a hollow region woven therein from fibres comprising heat-activatable fibre, which comprises;
   at least notionally splitting a zone of warp fibres into at least a first group of fibres and a second group of fibres, such that the fibres of the first group alternate regularly or irregularly with those of the second group;
   inserting weft fibres (a) to interlace warp fibres of the first group but not of the second group, and inserting weft fibres (b) to interlace warp fibres of the second group but not of the first group, thus causing two layers of fabric to be woven; and either (i) inserting said weft fibres (a) and (b) into warp fibres which border said zone, thus providing a join between the two layers or (ii) providing weft fibres (a) and weft fibres (b) as a continuous running weft, or (iii) providing a knitted stitch joining said two layers;
   the number of said groups of fibres, or the number of fibres within at least one of the groups varying in the warp direction such that an angled or branched hollow fabric is produced.

6. A heat-activatable article comprising a woven fabric having recovery localized along or different extents of recovery along, the warp direction.

7. A method of making an article according to claim 6, which method employs a first group of warp fibres of lower or zero recovery and a second group of warp fibres of higher recovery, such that fibres of the first group alternate regularly or irregularly with those of the second group, the warp fibres with which the weft interlaces changing along the warp direction from one of said groups to the other.

8. A method of protecting or holding a substrate comprising a cable or cable splice which comprises surrounding the substrate by a heat activatable article comprising a fabric having a hollow region woven therein which hollow region corresponds to the configuration of the substrate.

9. A method according to claim 8, in which the fabric has an electrically conductive component by means of which the fabric provides electromagnetic screening.

10. A method according to claim 8, in which the fabric is recoverable and the method additionally comprises recovering the fabric into engagement with the substrate.

11. A method according to claim 10, in which the substrate is branched or angular.

12. An article according to claim 2 in which the fabric comprises conductive fibers by means of which the fabric exhibits electromagnetic screening.

13. An article according to claim 1 in which the fabric comprises heat-activatable fibers such that the fabric becomes impermeable or is capable of bonding to a substrate on heating or becomes substantially rigid.

14. An article according to claim 2 in which the fabric comprises heat-activatable fibers such that the fabric becomes impermeable or is capable of bonding to a substrate on heating or becomes substantially rigid.

15. An article according to claim 6 in which the fabric comprises heat-recoverable fibers.

16. An article according to claim 6 in which the fabric comprises conductive fibers by means of which the fabric exhibits electromagnetic screening.

17. An article according to claim 6 in which the fabric comprises heat-activatable fibers such that the fabric becomes impermeable or is capable of bonding to a substrate on heating or becomes substantially rigid.

18. An article according to claim 15 in which the fabric comprises conductive fibers by means of which the fabric exhibits electromagnetic screening.

19. An article according to claim 15 in which the fabric comprises heat-activatable fibers such that the fabric becomes impermeable or is capable of bonding to a substrate on heating or becomes substantially rigid.

20. An article according to claim 16 in which the fabric comprises heat-activatable fibers such that the fabric becomes impermeable or is capable of bonding to a substrate on heating or becomes substantially rigid.

* * * * *